United States Patent [19]

Agnello et al.

[11] Patent Number: 5,635,242

[45] Date of Patent: Jun. 3, 1997

[54] METHOD AND APPARATUS FOR PREVENTING RUPTURE AND CONTAMINATION OF AN ULTRA-CLEAN APCVD REACTOR DURING SHUTDOWN

[75] Inventors: Paul D. Agnello, Wappingers Falls; Thomas O. Sedgwick, Croton-on-Hudson, both of N.Y.

[73] Assignee: International Business Machines Corporation, Armonk, N.Y.

[21] Appl. No.: 459,261

[22] Filed: Jun. 2, 1995

Related U.S. Application Data

[62] Division of Ser. No. 227,752, Apr. 14, 1994, Pat. No. 5,487,783.

[51] Int. Cl.$^6$ ............................................ C23C 16/00
[52] U.S. Cl. ..................... 427/248.1; 427/8; 118/715
[58] Field of Search .................... 427/8, 248.1; 118/692, 118/708, 712, 715; 137/505.11; 34/402, 403, 406, 558, 559

[56] References Cited

U.S. PATENT DOCUMENTS

| | | | |
|---|---|---|---|
| 4,081,574 | 3/1978 | Hawkins et al. | 427/237 |
| 4,098,923 | 7/1978 | Alberti et al. | 427/85 |
| 4,369,031 | 1/1983 | Goldman et al. | 432/198 |
| 4,393,013 | 7/1983 | McMenamin | 261/648 |
| 4,674,443 | 6/1987 | Furukawa et al. | 118/783 |
| 4,834,020 | 5/1989 | Bartholomew et al. | 118/719 |
| 4,910,042 | 3/1990 | Hokynar | 427/38 |
| 4,990,365 | 2/1991 | Treichel et al. | 427/45.1 |
| 5,015,503 | 5/1991 | Varrin, Jr. et al. | 427/255.2 |
| 5,062,386 | 11/1991 | Christensen | 118/725 |
| 5,078,006 | 1/1992 | Maresca, Jr. et al. | 73/40.5 |
| 5,122,391 | 6/1992 | Mayer | 427/126.3 |
| 5,252,134 | 10/1993 | Stauffer | 118/726 |

FOREIGN PATENT DOCUMENTS

| | | |
|---|---|---|
| 1-268116 | 10/1989 | Japan . |
| 2-224220 | 9/1990 | Japan . |

*Primary Examiner*—Shrive Beck
*Assistant Examiner*—Timothy H. Meeks
*Attorney, Agent, or Firm*—Ratner & Prestia

[57] ABSTRACT

A method of maintaining an optimum pressure and purity level in a vessel having an inlet gas flow and an outlet gas flow during shutdown of the vessel that prevents imploding of the vessel when the inlet and outlet gas flows are discontinued. Gas from the vessel is directed to a containment portion in communication with the vessel. The pressure of the gas in the containment portion is monitored; the containment portion is backfilled with a purified inert gas when the monitored pressure drops to a predetermined lower level; and the containment portion is vented when the monitored pressure rises to a predetermined higher level. Apparatus for maintaining an optimum pressure and purity level in a vessel having an inlet gas flow and an outlet gas flow during shutdown of the vessel that prevents imploding of the vessel when the inlet and outlet gas flows are discontinued is also provided. The apparatus includes a containment portion adjacent to the vessel and in communication with the vessel for containing gas from the vessel, a back-pressure regulator and a conventional regulator for monitoring the pressure of the containment portion, a high-purity inert purge gas source in communication with the conventional regulator, adapted to backfill the containment portion with purified inert gas when the monitored pressure drops to a predetermined lower level, the back-pressure regulator adapted to vent the containment portion when the monitored pressure rises to a predetermined higher level.

6 Claims, 1 Drawing Sheet

METHOD AND APPARATUS FOR PREVENTING RUPTURE AND CONTAMINATION OF AN ULTRA-CLEAN APCVD REACTOR DURING SHUTDOWN

This application is a division of application Ser. No. 08/227,752, filed Apr. 14, 1994, now U.S. Pat. No. 5,487,783.

FIELD OF THE INVENTION

This invention relates to ultra-clean atmospheric pressure reactors, and more particularly to the prevention of contamination and rupture of such reactors during a shutdown.

BACKGROUND OF THE INVENTION

Ultra-clean atmospheric pressure chemical vapor deposition (APCVD) reactors are used conventionally in the fabrication of semiconductor devices. In the reactor, reactant gases are brought together to carry on a reaction over a silicon wafer. Using this technique, it is possible to deposit layers of polysilicon, silicon dioxide, or other compounds on the wafer. A typical horizontal tube-type APCVD consists of a horizontal quartz tube having reactant gases metered into one end of the tube and unused or bi-product gases exhausted out the other end.

With ultra-clean APCVD reactors, it is necessary to prevent oxygen, water vapor, and other contaminants from the ambient atmosphere from entering the reactor. In some applications, the oxygen and water vapor levels must be kept below 10 parts per billion. A high purity environment such as that in an ultra-clean APCVD reactor is known as a load-locked environment.

Maintaining the high purity level in an ultra-clean APCVD becomes problematic when the reactor is shutdown as a result of a power failure or a fault in any of the systems associated with the reactor. Two techniques are currently used to maintain the purity of the reactor during a shutdown.

The first of these techniques is known as the closed-system technique. During a shutdown, the closed-system technique uses valving to shut off the gas flow to and from the reactor automatically. In this way, contaminants are prevented from entering the reactor. A problem arises, however, as the reactor cools from its operational temperature of as high as 1200° C. to room temperature. As a result of the temperature drop, there is a corresponding drop in pressure within the reactor from the operational pressure of approximately atmospheric pressure. The pressure decrease inside the reactor can result in an implosion pressure of as high as 12 psi exerted by the atmosphere on the reactor vessel. Such a pressure can easily rupture a typical quartz reactor tube with rectangular cross-section. Laboratory reactor tubes have been known to explode with outward overpressure differentials of 3 to 7 psi. Aside from the material loss, reactor tube rupture of APCVD's is particularly dangerous because of the presence of toxic and/or flammable gases typically used in APCVD reactors.

The second technique used to prevent influx of ambient contaminants is known as the open-system technique. Here, only the inlet valve to the reactor from the toxic and/or flammable sources is discontinued automatically. The reactor outlet remains open and an inert gas purge such as nitrogen is started into the reactor that purges the reactor contents into the exhaust duct work. Although the open-system technique avoids the problems of reactor implosion associated with the closed-system technique, it has two other distinct problems associated with it.

First, if the system faults and the reactor shuts down due to an exhaust failure, the contents of the reactor, including toxic and/or flammable gases, are discharged into the non-functioning exhaust. In this event, it is possible that the toxic gases discharged from the reactor could enter laboratory or work space and become a significant safety hazard.

Second, the open-system technique requires a constant inert gas flow. If the inert purge is ever discontinued (for example, if the purge or the purge gas source needs to be shut down for maintenance), particles from the ambient environment can enter and contaminate the reactor. This results in significant down-time in order to dry the system before normal operation can be resumed.

SUMMARY OF THE INVENTION

A method of maintaining an optimum pressure and purity level in a vessel having an inlet gas flow and an outlet gas flow during shutdown of the vessel that prevents imploding of the vessel when the inlet and outlet gas flows are discontinued. Gas from the vessel is directed to a containment portion in communication with the vessel. The pressure of the gas in the containment portion is monitored; the containment portion is backfilled with a purified inert gas when the monitored pressure drops to a predetermined lower level; and the containment portion is vented when the monitored pressure rises to a predetermined higher level.

Apparatus for maintaining an optimum pressure and purity level in a vessel having an inlet gas flow and an outlet gas flow during shutdown of the vessel that prevents imploding of the vessel when the inlet and outlet gas flows are discontinued is also provided. The apparatus includes a containment portion adjacent to the vessel and in communication with the vessel for containing gas from the vessel, a back-pressure regulator and a conventional regulator for monitoring the pressure of the containment portion, a high-purity inert purge gas source in communication with the conventional regulator, adapted to backfill the containment portion with purified inert gas when the monitored pressure drops to a predetermined lower level, the back-pressure regulator adapted to vent the containment portion when the monitored pressure rises to a predetermined higher level.

DETAILED DESCRIPTION OF THE INVENTION

Figure 1:
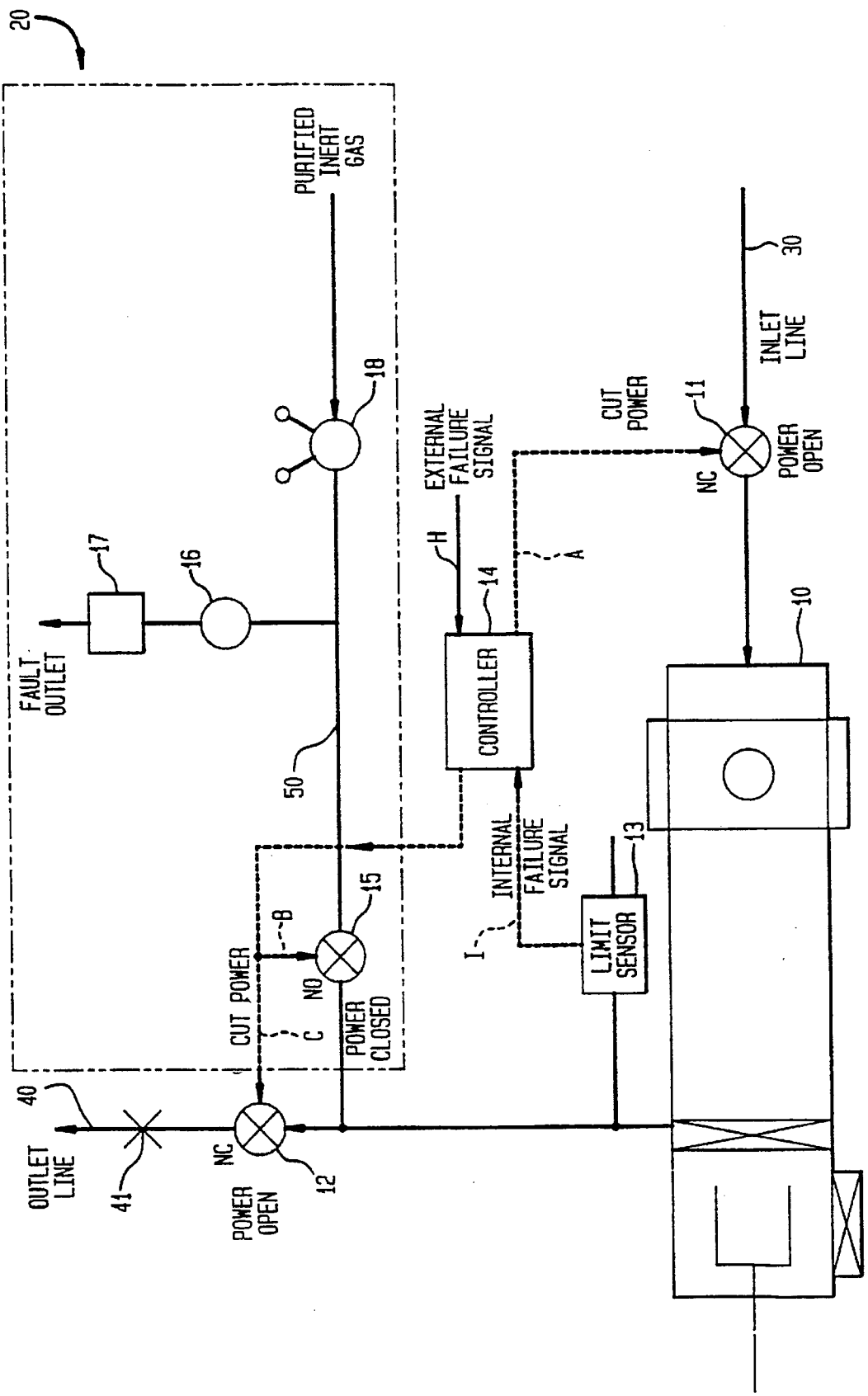
FIG. 1 is a schematic representation of an embodiment of the present invention.

An exemplary embodiment of the present invention will now be described more fully with reference to FIG. 1. In FIG. 1, reactor vessel 10 has inlet line 30 and outlet line 40 as shown. Reactor vessel 10 in this embodiment is an ultra-clean horizontal quartz tube APCVD reactor used in the deposition of Si or Si/Ge onto silicon wafers. Normally closed (NC) valve 11 is disposed in the inlet line, and normally closed (NC) valve 12 is provided in the outlet line. During normal reactor operation, valve 11 and valve 12 are both powered open. This allows inlet gas to flow from the source gas manifold (not shown), through powered-open valve 11, and into the reactor. Outlet gas from the reactor flows through powered-open valve 12, through an optional manual valve 41, and into the exhaust duct (not shown). Normally open (NO) valve 15, provided in line 50 which is connected to outlet line 40 upstream of valve 12 is powered closed during normal operation.

In this embodiment of the invention, controller 14 is provided. The operational characteristics of controller 14 are given in detail below. Controller 14 senses both internal failure signals I from limit sensor 13 (a capacitance manometer or other pressure sensing device with limit switches, such as an MKS Type 241A pressure switch) and external failure signals H (such as power failure or exhaust failure). Upon receipt of such a failure signal, controller 14 initiates shutdown of the reactor.

Limit sensor 13 in this embodiment has a trigger value set to +/−100 TORR relative to atmospheric pressure, the pressure at which the APCVD is operating. If the pressure within the system deviates an amount greater than this trigger value, limit sensor 13 sends a failure signal I to controller 14 that then initiates shutdown of the reactor.

Once controller 14 receives a failure signal from either H or I, controller 14 depowers normally closed valve 11 by sending signal A to the valve. When the power is cut to valve 11, the valve returns to its normally closed position. This stops gas input to the reactor. At the same time, controller cuts the power to normally closed valve 12 (via signal C), which thus closes, and normally open valve 15 (via signal B), which thus opens. Spent reactor gases outputted from the vessel no longer pass to the exhaust but are directed through valve 15 into containment portion 20 having back-pressure regulator 16 and low pressure regulator 18. Containment portion 20 is adjacent to reactor 10. In the exemplary embodiment, back-pressure regulator 16 is a Veriflo BTR-30 Series, and low pressure regulator 18 is a Matheson Model 8-2. The pressure and purity level in containment portion 20 is substantially the same as that in reactor 10.

In the event that the fault in the system causing shutdown is an overpressure condition, back-pressure regulator 16 allows reactor gases to flow through valve 15, through back-pressure regulator 16, through a flow indicator 17, and into a vent (not shown). Flow indicator 17 in the exemplary embodiment is a Matheson 7600 Series flowmeter. The back-pressure regulator in this embodiment is set to approximately 90 Torr above atmospheric pressure. Gases are thus allowed to be vented from the system until the system pressure is reduced to the set value of the back-pressure regulator—90 Torr above atmospheric pressure in this case. Once the pressure is reduced to the set value, back-pressure regulator 16 discontinues the venting, and all reactor gases are contained within the system. In no event are toxic/flammable reactor gases discharged into the exhaust duct beyond valve 12. Such containment is particularly advantageous when the shutdown results from exhaust failure, and hazardous gas discharge into non-functioning duct work is a possibility.

Once the reactor shuts down for any reason, pressure decrease in the reactor resulting from the cooling of the hot reactor to room temperature becomes problematic because of the possibility of implosion. Using the present invention, however, this problem is remedied.

The pressure of the reactor gases in containment portion 20 is monitored during a shutdown by low pressure regulator 18. Low pressure regulator 18 in this embodiment is set close to 90 Torr above atmospheric pressure. Should the monitored reactor gas pressure drop below the set value, regulator 18 delivers purified inert gas from an independent inert gas source (not shown) such as a gas bottle with purifier. The inert gas preferably has oxygen and water vapor concentrations of less than 10 parts per billion, substantially the same purity level as in the reactor. The inert gas back-flows through valve 15 to the reactor to keep the pressure near atmospheric pressure (atmospheric pressure +90 Torr in the present embodiment). By maintaining the pressure at this level, the implosion hazard is avoided.

In the exemplary embodiment of the present invention, back-pressure regulator 16 and low pressure regulator 18 are coordinated to prevent any possible influx of ambient gas from the vent through back-pressure regulator 16 during the shutdown. In this embodiment, low pressure regulator 18 has a delivery pressure that is set just above the pressure of back-pressure regulator 16. For example, with back-pressure regulator 16 set at 90 Torr, low pressure regulator 18 is set to deliver purified inert gas purged at 90+Δ Torr. With such a setting, a trickle purge of purified inert gas constantly flows from the inert gas source through low pressure regulator 18, back-pressure regulator 16, flow indicator 17, and out to the vent. Back diffusion of ambient gases through back-pressure regulator 16 is thus prevented, although a very slight discharge to the vent of reactor gases entrained in the trickle purge occurs. If desired, low pressure regulator 18 is set to 90−Δ Torr (just below the pressure of back-pressure regulator 16). In this case, containment of reactor gases is optimized, but there is a slight possibility that trace ambient gases will back diffuse through back-pressure regulator 16 over time.

Regarding the operation of controller 14, signals are sent from controller 14 to valves 11, 12, and 15 based on the status of internal failure signals I from limit sensor 13 and external failure signals H such as power failure, exhaust failure, or other. A logic high is defined as (1) and a logic low as (0). The internal and external failure signals I and H are defined to be in the high state (1) under normal operating conditions and in the low state (0) under fault conditions. These signals operate through the controller 14 on valves 11, 12, and 15. The signals A, B, and C to the valves are defined to be in the logic high state (1) when power is applied to the valve (during normal operation) and in the logic low state (0) when no power is applied to the valves (fault condition). The logic low state (0) leaves the valve in its normal state—closed for a normally closed valve and open for a normally open valve. The logic high state (1) puts the valve in the opposite state —open for a normally closed valve and closed for a normally open valve.

Based on these definitions, controller 14 performs the following logical operation on the input signals to generate output signals to the valves:

$$A = H + I$$

$$B = H + I$$

$$C = H + I$$

where "+" is the logical AND operation. In the event of a power failure, the outputs A, B, and C are driven low (0). Additionally, because valves 12 and 15 are driven by the same wire from controller 14 in the preferred embodiment, these two valves are driven together and any failure in the controller 14 will always leave one valve open. Any inadvertent dangers of system isolation are thus avoided. Similarly, because back-pressure regulator 16 and low pressure regulator 18 are mechanical, power failure does not impede the operation of these devices. If desired, intentional reactor isolation or inadvertent failure of purge gas flow during a purge of the reactor, optional valve 41 may be manually closed, thereby generating a failure signal which is transmitted to controller 14 to initiate shutdown of the reactor and implementation of the present invention.

An arrangement of automatically operating mechanical devices, which may be implemented using standard components, is thus provided which is easily attached to an ultra-clean APCVD reactor to provide a containment portion having the same pressure and purity as the reactor itself. The devices trap the toxic/flammable gases within the reactor in the event of a fault and automatically provide backfill to the reactor of an inert ultra-clean gas, having a pressure and purity substantially the same as the gases in the containment portion, to prevent reactor implosion. The invention thus provides the advantages of allowing shutdown of the purge gas either to save purge gas during long shutdowns or to allow the system to remain closed to maintain its ultra-clean integrity during short shutdowns of the purge gas source for maintenance and/or because of source failure.

While the invention has been described in terms of an exemplary embodiment, it is contemplated that it may be practiced as outlined above with modifications within the spirit and scope of the appended claims.

What is claimed:

1. A method of maintaining an optimum pressure and purity level in a vessel having an inlet flow, an outlet gas flow, and an operating temperature sufficiently high to present an implosion risk upon cooling, during shutdown of the vessel to prevent imploding of the vessel when inlet and outlet gas flows are discontinued, comprising the steps of:
   a. detecting a shutdown of said vessel;
   b. opening a communication between said vessel and a containment portion when said shutdown is detected;
   c. monitoring the pressure of said containment portion;
   d. backfilling said containment portion with a purified inert gas when the monitored pressure drops to a lower level to prevent implosion of said vessel; and
   e. venting said containment portion when the monitored pressure rises to a higher level.

2. A method as claimed in claim 1 wherein said vessel is an atmospheric pressure reactor.

3. A method as claimed in claim 1 wherein said vessel is an ultra-clean atmospheric pressure chemical vapor deposition reactor.

4. A method as claimed in claim 1 wherein said optimum purity level is less than 10 parts per billion oxygen and less than 10 parts per billion water vapor.

5. A method as claimed in claim 1 wherein said purified inert gas has substantially the same purity level as said vessel.

6. A method of maintaining an optimum pressure and purity level in an ultra-clean atmospheric pressure chemical vapor deposition reactor during shutdown of said reactor when inlet gas flow and outlet gas flow to said reactor are discontinued, said method comprising the steps of:
   a. detecting a shutdown of said reactor;
   b. opening a communication between said reactor and a containment portion adjacent to said reactor when said shutdown is detected;
   c. monitoring the pressure of said containment portion;
   d. backfilling said containment portion with a purified inert gas when the monitored pressure drops to a lower level; and
   e. venting said containment portion when said monitored pressure rises to a higher level, wherein implosion of said reactor is prevented as said reactor cools from a normal operating temperature of approximately 600 to 1200 degrees C. to ambient temperature during said shutdown.

* * * * *